(12) United States Patent
Taguchi et al.

(10) Patent No.: US 7,876,036 B2
(45) Date of Patent: Jan. 25, 2011

(54) LIGHT EMITTING APPARATUS AND MANUFACTURING METHOD THEREFOR

(75) Inventors: Yuichi Taguchi, Nagano (JP); Masahiro Sunohara, Nagano (JP); Hideaki Sakaguchi, Nagano (JP); Akinori Shiraishi, Nagano (JP); Naoyuki Koizumi, Nagano (JP); Kei Murayama, Nagano (JP); Mitsutoshi Higashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 278 days.

(21) Appl. No.: 11/645,581

(22) Filed: Dec. 27, 2006

(65) Prior Publication Data
US 2007/0182307 A1    Aug. 9, 2007

(30) Foreign Application Priority Data
Dec. 28, 2005    (JP)    ............ P. 2005-378415

(51) Int. Cl.
*H01J 1/62* (2006.01)
(52) U.S. Cl. ............ 313/502; 313/506; 313/512
(58) Field of Classification Search ......... 313/498–512
See application file for complete search history.

(56) References Cited

U.S. PATENT DOCUMENTS

| 2005/0202598 A1* | 9/2005 | Suehiro et al. ............. 438/118 |
| 2005/0227569 A1* | 10/2005 | Maeda et al. ................. 445/25 |
| 2006/0043879 A1* | 3/2006 | Naitou ........................ 313/501 |
| 2006/0099449 A1* | 5/2006 | Amano et al. ............... 428/690 |

FOREIGN PATENT DOCUMENTS

JP    2003-110146    4/2003

* cited by examiner

*Primary Examiner*—Bumsuk Won
(74) *Attorney, Agent, or Firm*—Drinker Biddle & Reath LLP

(57) ABSTRACT

A light emitting apparatus, includes: a light emitting device accommodating body, which has a recessed portion wherein a light emitting device is accommodated; a wiring pattern, which is provided for the light emitting device accommodating body 11 and is electrically connected to the light emitting device; a light transmitting substrate, which is mounted on the light emitting device accommodating body and completely closes the recessed portion; and a phosphor-containing, ultraviolet curing resin, which is so deposited that, opposite to the light emitting device accommodating body, the face of the light transmitting member is covered.

4 Claims, 14 Drawing Sheets

LIGHT EMITTING APPARATUS AND MANUFACTURING METHOD THEREFOR

BACKGROUND OF THE INVENTION

The present invention relates to a light emitting apparatus and a manufacturing method therefor, and relates particularly to a light emitting apparatus wherein a light emitting device is closely covered by a light transmitting substrate and a light emitting device accommodating body, or a light transmitting member and a substrate, and a manufacturing method therefor.

A light emitting apparatus is constituted by a light emitting device, a substrate to which the light emitting device is electrically connected and phosphor, and for this light emitting apparatus chromaticity is important. In order to improve the chromaticity, there is one example conventional light emitting apparatus wherein a light transmitting member is so located that the upper face and the side faces of a light emitting device are enclosed, and phosphor is so positioned that the face of the light emitting member, opposite to the light emitting device, is covered (see FIG. 1).

To improve the chromaticity means to reduce the irregular color.

FIG. 1 is a cross-sectional view of a conventional light emitting apparatus.

While referring to FIG. 1, a light emitting apparatus 100 includes a light emitting device 102, a light transmitting member 103 and a phosphor 105. The substrate 101 is plate shaped and includes a wiring pattern (not shown). The light emitting device 102 is electrically connected to the wiring pattern (not shown) formed on the substrate 101. The light transmitting member 103 includes a recessed portion 104 that encloses the side faces and the upper face of the light emitting device 102, and includes a function that permits the passage of light emitted by the light emitting device 102.

The phosphor 105 is located so as to cover a face 103A of the light transmitting member 103 opposite to the recessed portion 104. These two components are bonded together by the application between them of an adhesive material 106.

As described above, since the light transmitting member 103 is arranged so as to enclose the side faces and the upper face of the light emitting device 102, and the phosphor 105 is located so as to cover the face 103A of the light transmitting member 103, opposite to the light emitting device 103, the chromaticity of the light emitting apparatus 100 can be increased (see, for example, patent document 1).

[Patent Document 1] JP-A-2003-110146

For the conventional light emitting apparatus 100, the chromaticity is improved; however, since the substrate 101 and the light transmitting member 103 are adhered to each other using the adhesive material 106, the cost of the light emitting apparatus 100 would be increased.

SUMMARY OF THE INVENTION

In order to resolve this shortcoming, it is one objective of the present invention to provide a light emitting apparatus that can provide improved chromaticity and reduced manufacturing costs, and a manufacturing method therefor.

According to a first aspect of the present invention, there is provided a light emitting apparatus including:

a light emitting device;

a light emitting device accommodating body, in which a recessed portion is formed to accommodate the light emitting device;

a light transmitting substrate, arranged on the light emitting device accommodating body, for closely sealing the recessed portion; and a phosphor-containing, ultraviolet curing resin, arranged so as to cover a face of the light transmitting substrate that is opposite to the light emitting device accommodating body.

According to this invention, since a phosphor-containing, ultraviolet curing resin is arranged so as to cover the face of the light transmitting substrate that is opposite to the light emitting device accommodating body, the chromaticity of the light emitting apparatus can be increased. Furthermore, since the light emitting device accommodating body and the light transmitting substrate can be bonded together using the phosphor-containing, ultraviolet violet curing resin, an adhesive material is not required, and the manufacturing costs for the light emitting apparatus can be reduced.

According to a second aspect of the invention, there is provided a light emitting apparatus including:

a light emitting device;

a substrate, which includes a wiring pattern electrically connected to the light emitting device;

a light transmitting member, which is arranged on the substrate and includes a recessed portion that encloses the light emitting device; and a phosphor-containing, ultraviolet curing resin, arranged so as to cover a face of the light transmitting substrate opposite to the substrate and a face of the light transmitting member corresponding to the recessed portion.

According to this invention, since a phosphor-containing, ultraviolet curing resin is arranged so as to cover the face of the light transmitting member opposite to the substrate and the face of the light transmitting member corresponding to the recessed portion, the chromaticity of the light emitting apparatus can be increased. Further, since the substrate and the light transmitting member can be adhered to each other using the phosphor-containing, ultraviolet curing resin, an adhesive material is not required, and the manufacturing costs for the light emitting apparatus can be reduced.

According to a third aspect of the invention, there is provided a method for manufacturing a light emitting apparatus that includes a light emitting device, a light emitting device accommodating body including a recessed portion for accommodating the light emitting device, and a light transmitting substrate on the light emitting device accommodating body, that the recessed portion is closely sealed, the method including:

a phosphor-containing resin forming step of forming a phosphor-containing, ultraviolet curing resin to cover a face of the light transmitting substrate that is opposite to the light emitting device accommodating body; and a phosphor-containing resin curing step of bringing the phosphor-containing, ultraviolet curing resin, formed on the light transmitting substrate, into contact with the light emitting device accommodating body, wherein the light emitting device is present, and of curing the phosphor-containing, ultraviolet curing resin using ultraviolet irradiation.

According to this invention, since the light emitting device accommodating body, wherein the light emitting device is present, is brought into contact with the phosphor-containing, ultraviolet curing resin that is formed on the light transmitting substrate and that is cured, thereafter, using ultraviolet irradiation, the light emitting device accommodating body and the light transmitting substrate can be adhered to each other. Through this processing, an adhesive material is not required to adhere the light emitting device accommodating body to the light transmitting substrate, and the manufacturing costs for the light emitting apparatus can be reduced.

According to a forth aspect of the invention, there is provided a method for manufacturing a light emitting apparatus that includes a light emitting device, a substrate including a wiring pattern electrically connected to the light emitting device, and a light transmitting member which is arranged on the substrate and includes a recessed portion that encloses the light emitting device, the method including:

a phosphor-containing resin forming step of forming a phosphor-containing, ultraviolet curing resin, to cover a face of the light transmitting substrate opposite to the substrate and a face of the light transmitting member corresponding to the recessed portion; and a phosphor-containing resin curing step of bringing the phosphor-containing, ultraviolet curing resin, formed on the light transmitting member, into contact with the substrate electrically connected to the light emitting device, and of curing the phosphor-containing, ultraviolet curing resin using ultraviolet irradiation.

According to the invention, since the phosphor-containing, ultraviolet curing resin formed on the light transmitting member is brought into contact with the substrate electrically connected to the light emitting device and is cured, thereafter, using ultraviolet irradiation, the substrate and the light transmitting member can be adhered to each other. Through this processing, an adhesive material is not required for bonding the substrate and the light transmitting member, and the manufacturing costs for the light emitting apparatus can be reduced.

According to the invention, the chromaticity of the light emitting apparatus is increased and the manufacturing costs for this apparatus are reduced.

DETAILED DESCRIPTION OF THE PREFERRED EMBODIMENTS

The preferred embodiments of the present invention will now be described while referring to the accompanying drawings.

First Embodiment

Figure 1:
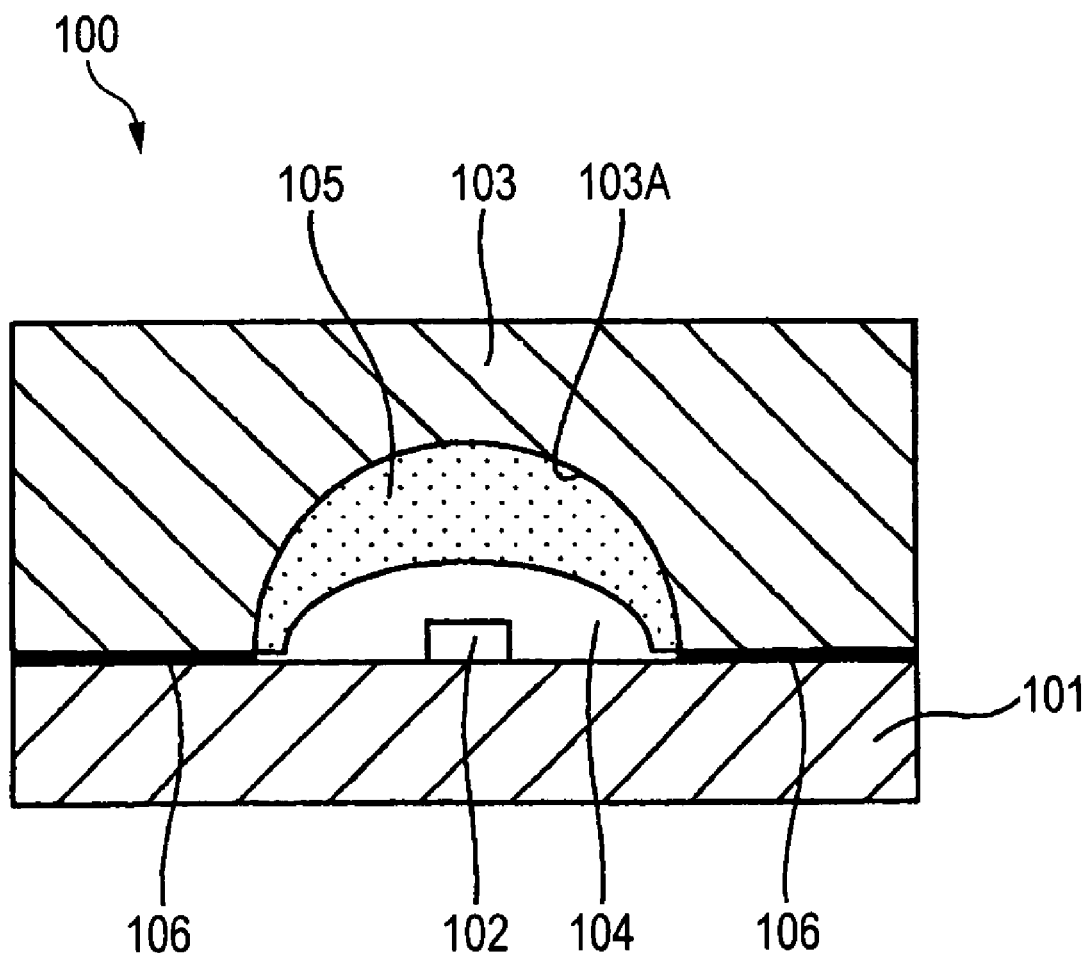
FIG. 1 is a cross-sectional view of a conventional light emitting apparatus.
Figure 2:
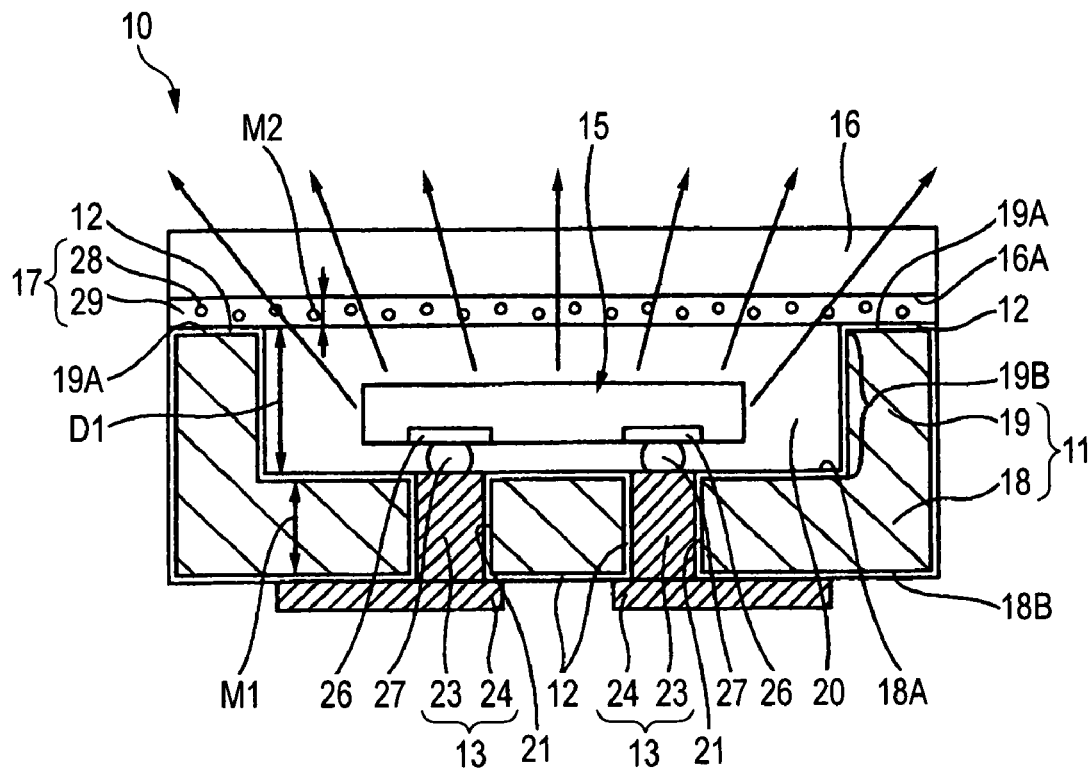
FIG. 2 is a cross-sectional view of a light emitting apparatus according to a first embodiment of the present invention.

FIG. 2 is a cross-sectional view of a light emitting apparatus according to a first embodiment of the present invention. Arrows in FIG. 2 indicate the forward direction of light emitted by a light emitting device 15.

A light emitting apparatus 10 according to the first embodiment of the invention will now be described while referring to FIG. 2. The light emitting apparatus 10 includes: a light emitting device accommodating body 11, an insulating film 12, a wiring pattern 13, a light emitting device 15, a light transmitting substrate 16 and a phosphor-containing, ultraviolet curing resin 17. The light emitting apparatus 10 is so designed that light having a desired color is provided after light emitted by the light emitting device 15 has passed through the phosphor-containing, ultraviolet curing resin 17. As an example, a light emitting diode that emits white light can be employed as the light emitting apparatus 10. In the following explanation for this embodiment, a white light emitting diode is employed as the light emitting apparatus 10.

The light emitting device accommodating body 11 includes a plate portion 18, a frame portion 19 and a recessed portion 20. The plate portion 18 is integrally formed with and supports the frame portion 19. A plurality of through holes 21 are formed in the plate portion 18, the thickness M1 of which is 200 μm, for example. The frame portion 19 is positioned on and integrally formed with the plate portion 18. The recessed portion 20 is defined by an upper face 18A of the plate portion 18 and an inner wall 19B of the frame portion 19, and is used to accommodate the light emitting device 15. The recessed portion 20 may be shaped, for example, like a cylinder or a quadrangular prism, and a depth D1 of this recessed portion 20 may be 200 μm, for example. The light emitting device accommodating body 11 may, for example, be made of silicon.

The insulating film 12 is deposited to cover the surface (including the walls of the through holes 21) of the light emitting device accommodating body 11. The insulating film 12 is used to insulate the light emitting device accommodating body 11 from the wiring pattern 13. An oxide film, for example, maybe employed as the insulating film 12, which has a thickness, for example, of 1 μm. In this embodiment, the insulating film 12 must be deposited so as to cover, at the least, a lower face 18B of the plate portion 18 and the walls of the through holes 21 in the light emitting device accommodating body 11.

The wiring pattern 13 includes vias 23 and wires 24. The vias 23 are located in the through holes 21 in which the insulating film 21 is deposited. The upper ends of the vias 23 are electrically connected to the light emitting device 15, and the lower ends are connected to the wires 24. A conductive metal can be used as the material for the vias 23; as an example, Cu, specifically, can be employed.

The wires 24 are provided on the lower face 18B of the plate portion 18 on which the insulating film 12 is formed, and the wires 24 are connected to the lower ends of the vias 23. Thus, the wires 24 are electrically connected by the vias 23 to the light emitting device 15, and serve as the external connection terminals of the light emitting apparatus 10. A conductive metal can be used as the material for the wires 24; as an example, specifically, an Ni/An film, which is obtained by laminating an Ni layer and an Au layer on the insulating film 12 in the named order, can be employed.

The light emitting device 15 is accommodated in the recessed portion 20 of the light emitting device accommodating body 11. The light emitting device 15 is a device that emits light of a predetermined color, and includes electrodes 26. Since these electrodes 26 are electrically connected to the vias 23 at bumps 27, the light emitting device 15 is electrically connected to the wiring pattern 13. When the light emitting apparatus 10 is to emit white light, a blue LED (light emitting diode), for example, can be employed as the light emitting device 15.

The light transmitting substrate 16 is located on the light emitting device accommodating body 11, visible through the phosphor-containing, ultraviolet curing resin 17. The light transmitting substrate 16 is used to transmit light emitted by the light emitting device 15 and also to tightly close the recessed portion 20. A glass substrate, for example, may be employed as the light transmitting substrate 16.

The phosphor-containing, ultraviolet curing resin 17 is arranged so as to cover a face 16A of the light transmitting substrate 16 opposite to the light emitting device accommodating body 11. The phosphor-containing, ultraviolet curing resin 17 contacts the insulating film 12 deposited on an upper face 19 of the frame portion 19. The phosphor-containing ultraviolet curing resin 17 is a material wherein phosphor particles 28 are dispersed in an ultraviolet curing resin 29, and when the light emitting apparatus 18 is to emit white light, particles of a yellow emitting phosphor need only be employed as the phosphor particles 28. As an example, yellow emitting phosphor, a YAG phosphor, can be employed.

The ultraviolet curing resin 29 is a resin that is cured using ultraviolet irradiation, and serves as an adhesive material. The ultraviolet curing resin 29 includes, for example, a base resin, a photo polymerization initiator and a thermosetting catalyst. An epoxy resin or an acrylic resin, for example, can be employed as a base resin; benzoin ether (specifically, for example, benzoin isopropyl ether) can be employed as a photo polymerization initiator; and an amine catalyst (specifically, diamine or polyamine, for example) can be employed as a thermosetting catalyst.

As described above, since the phosphor-containing, ultraviolet curing resin 17 covers the face 16A of the light transmitting substrate 16 opposite to the light emitting device accommodating body 11, and light emitted by the light emitting device 15 always passes through the phosphor-containing, ultraviolet curing resin 17, the chromaticity of the light emitting apparatus 10 can be improved.

Further, since the phosphor-containing, ultraviolet curing resin 17 that serves as an adhesive material is located between the light emitting device accommodating body 11 and the light transmitting substrate 16, the light emitting device accommodating body 11 and the light transmitting substrate 16 can be adhered to each other, and thus, no adhesive material is required to bond these components. Therefore, the manufacturing costs for the light emitting apparatus 11 can be reduced.

The phosphor-containing, ultraviolet curing resin 17 can be deposited, for example, by using squeegee printing, spin coating, a dispensing method, offset printing or inkjet printing. A thickness M2 of the phosphor-containing, ultraviolet curing resin 17 depends on desired luminance and chromaticity, and is, for example, 50 μm.

According to this embodiment, chromaticity of this light emitting apparatus 10 can be increased by forming the phosphor-containing, ultraviolet curing resin 17 so that it covers the face 16A of the light transmitting substrate 16 opposite to the light emitting device accommodating body 11.

Further, since the phosphor-containing, ultraviolet curing resin 17 is arranged between the light emitting device accommodating body 11 and the light transmitting substrate 16 to bond these two components, an adhesive material for adhering them to each other is not required, and the manufacturing costs of the light emitting apparatus 10 can be reduced.

Figure 3A:
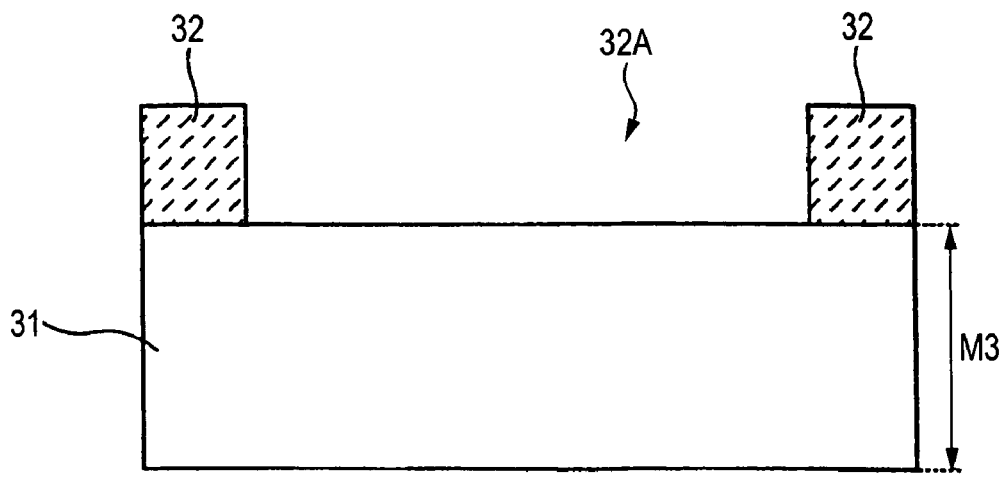
FIG. 3A is a diagram (1) showing the light emitting apparatus manufacturing processing according to the first embodiment of the invention.
Figure 3B:
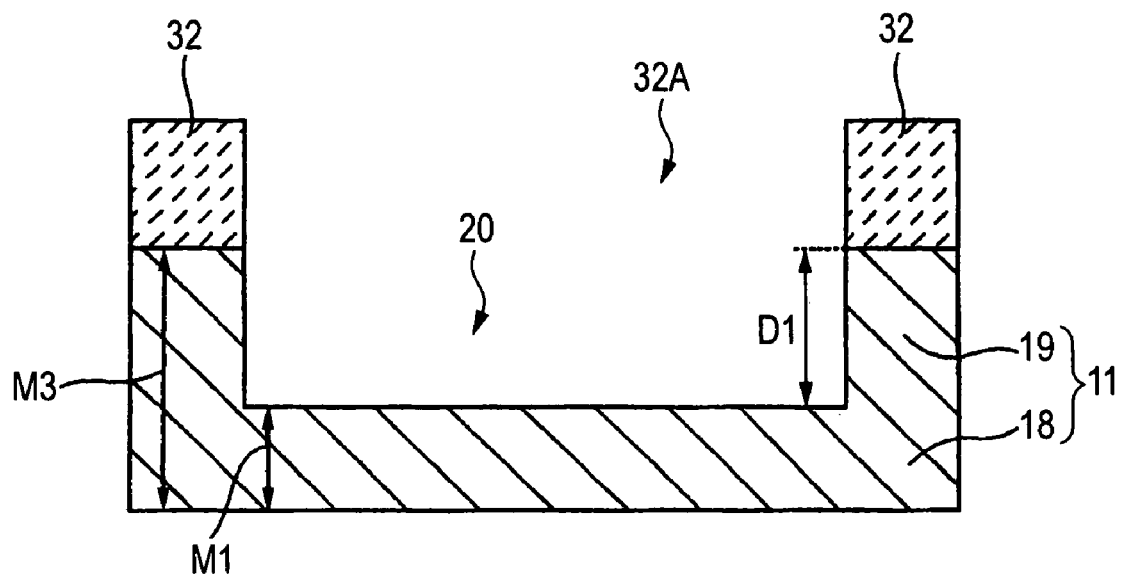
FIG. 3B is a diagram (2) showing the light emitting apparatus manufacturing processing according to the first embodiment of the invention.
Figure 3C:
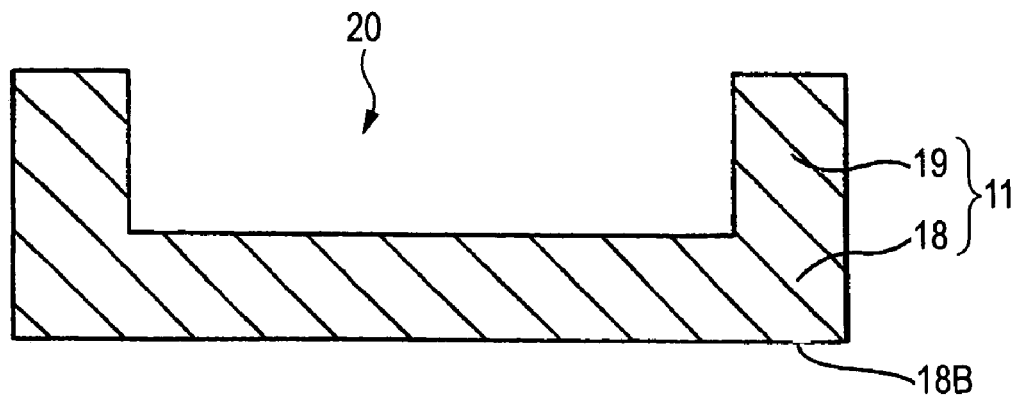
FIG. 3C is a diagram (3) showing the light emitting apparatus manufacturing processing according to the first embodiment of the invention.
Figure 3D:
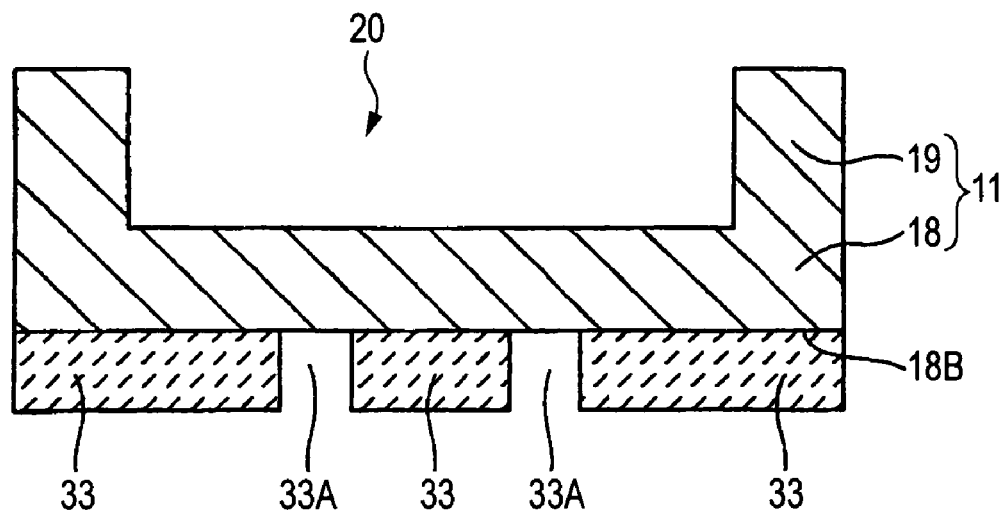
FIG. 3D is a diagram (4) showing the light emitting apparatus manufacturing processing according to the first embodiment of the invention.
Figure 3E:
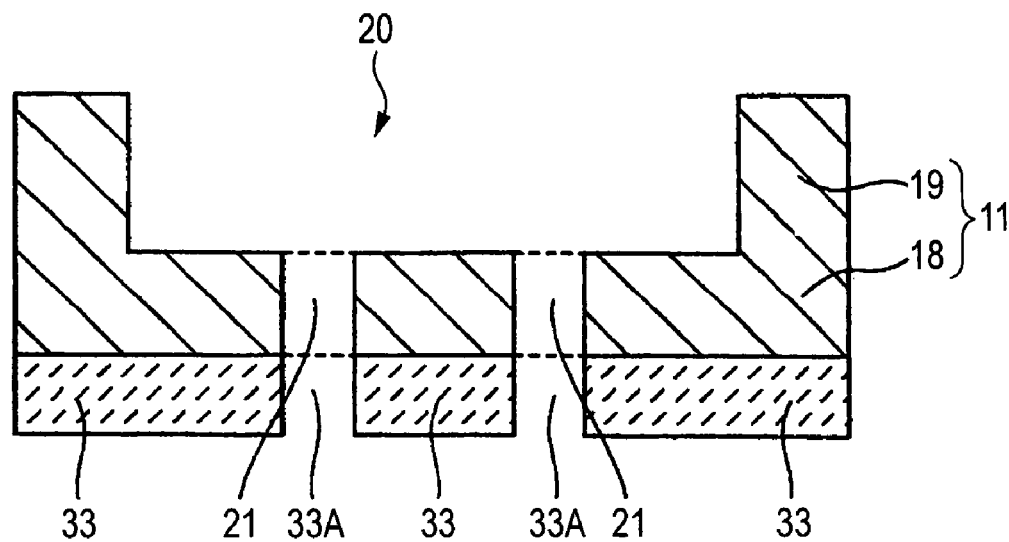
FIG. 3E is a diagram (5) showing the light emitting apparatus manufacturing processing according to the first embodiment of the invention.
Figure 3F:
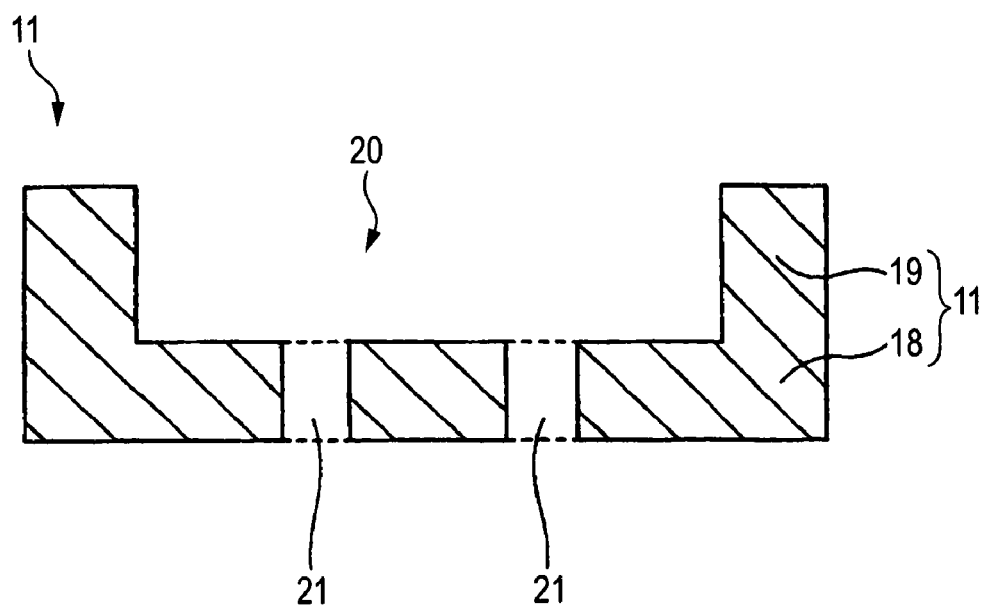
FIG. 3F is a diagram (6) showing the light emitting apparatus manufacturing processing according to the first embodiment of the invention.
Figure 3G:
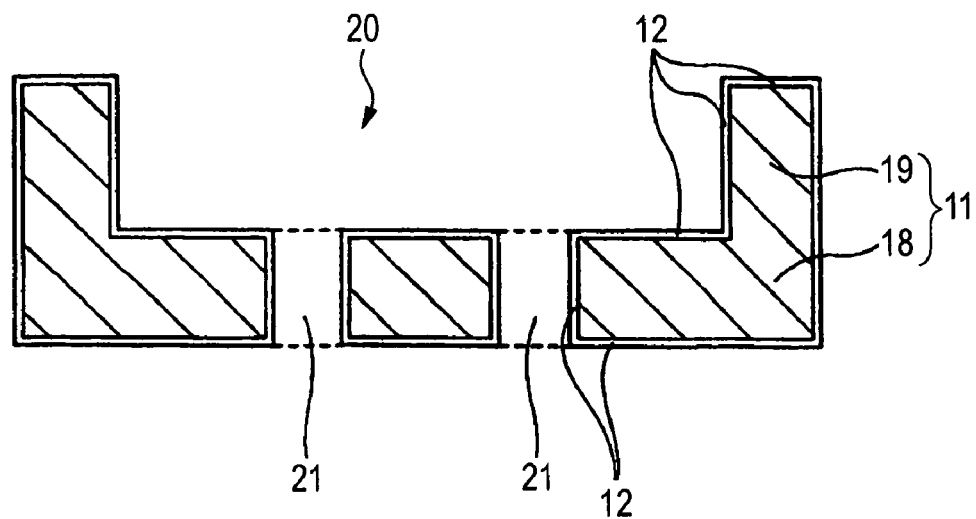
FIG. 3G is a diagram (7) showing the light emitting apparatus manufacturing processing according to the first embodiment of the invention.
Figure 3H:
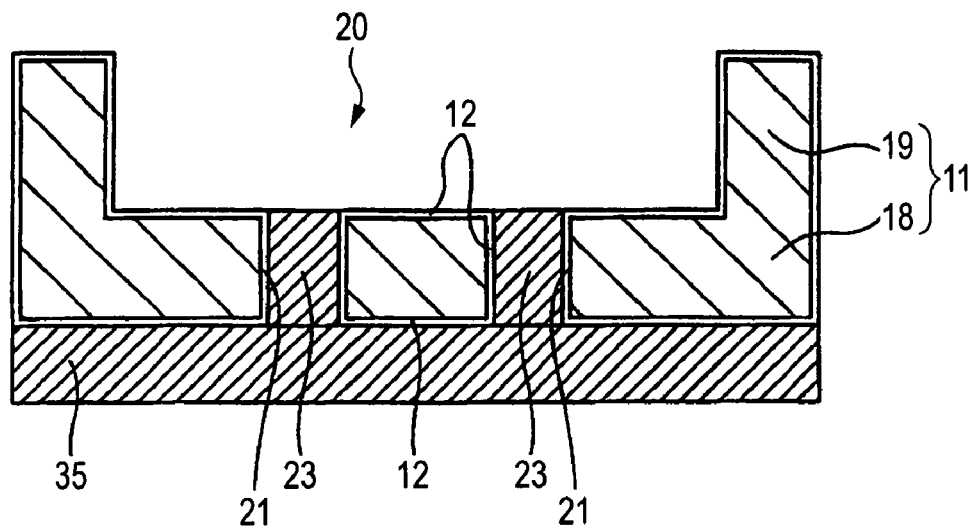
FIG. 3H is a diagram (8) showing the light emitting apparatus manufacturing processing according to the first embodiment of the invention.
Figure 3I:
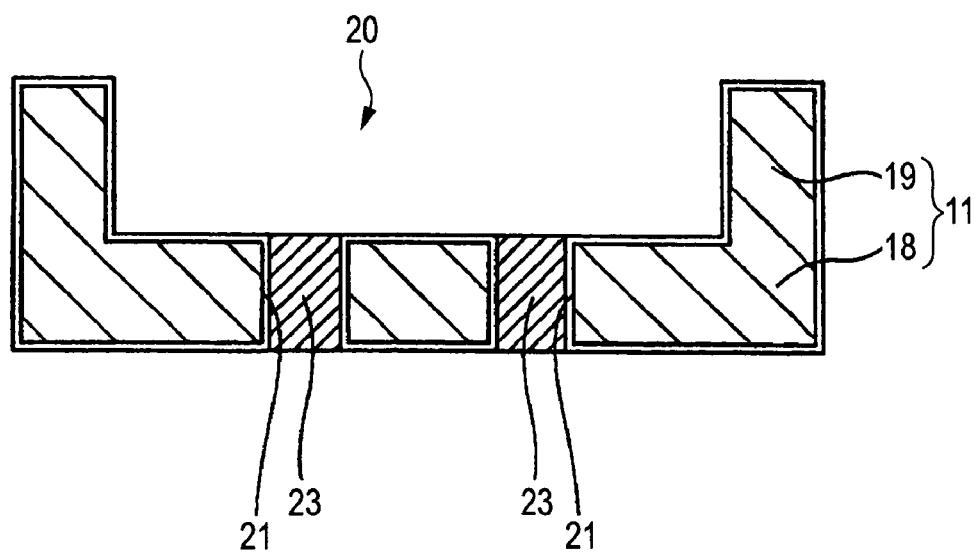
FIG. 3I is a diagram (9) showing the light emitting apparatus manufacturing processing according to the first embodiment of the invention.
Figure 3J:
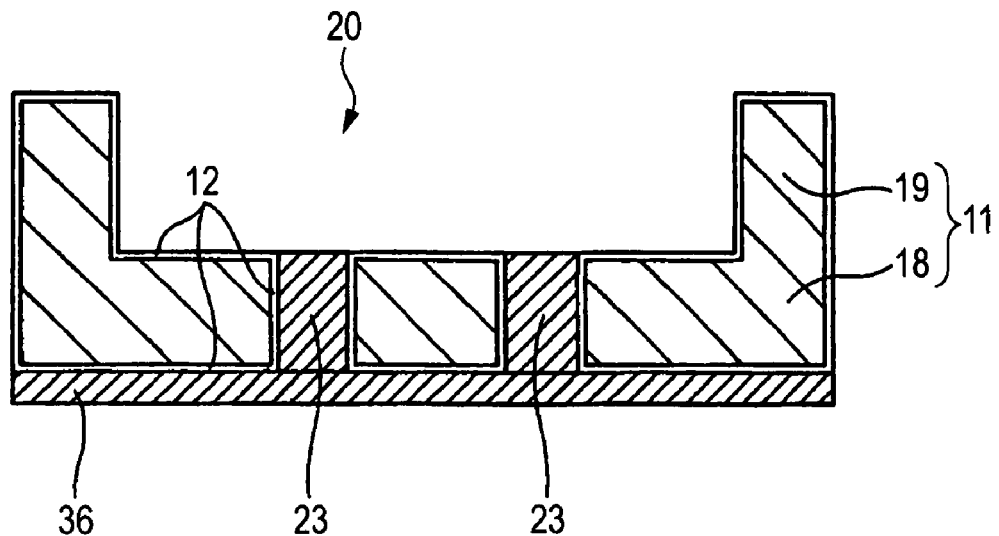
FIG. 3J is a diagram (10) showing the light emitting apparatus manufacturing processing according to the first embodiment of the invention.
Figure 3K:
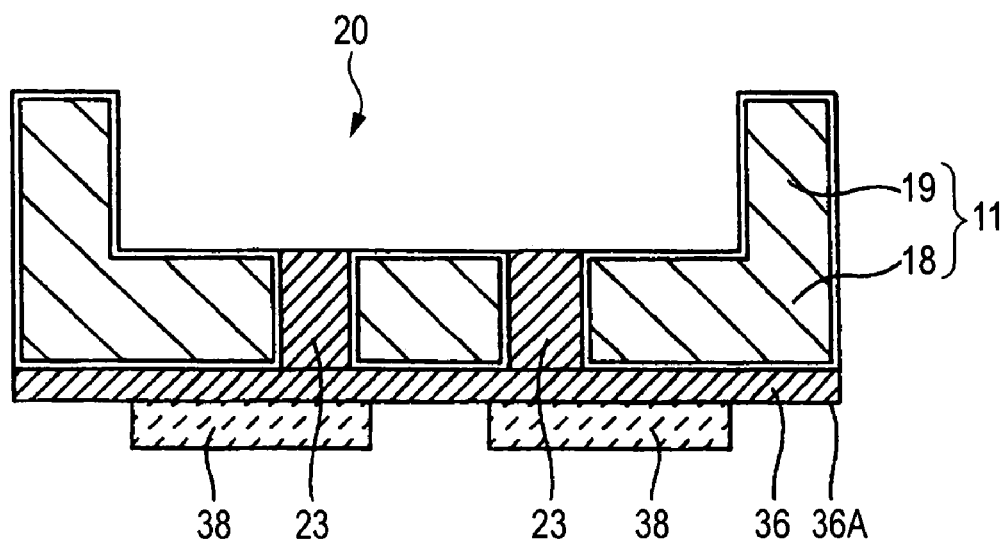
FIG. 3K is a diagram (11) showing the light emitting apparatus manufacturing processing according to the first embodiment of the invention.
Figure 3L:
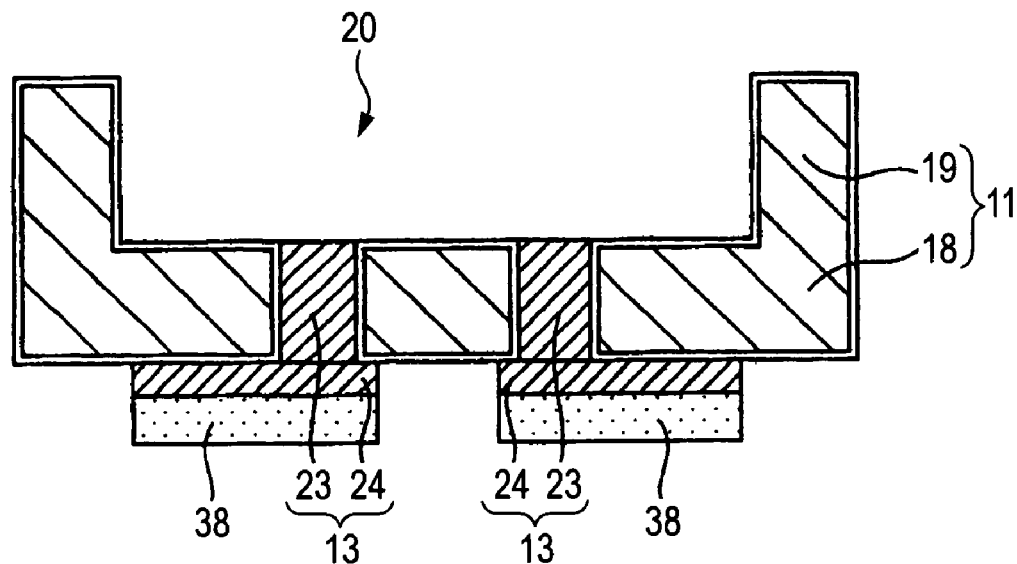
FIG. 3L is a diagram (12) showing the light emitting apparatus manufacturing processing according to the first embodiment of the invention.
Figure 3M:
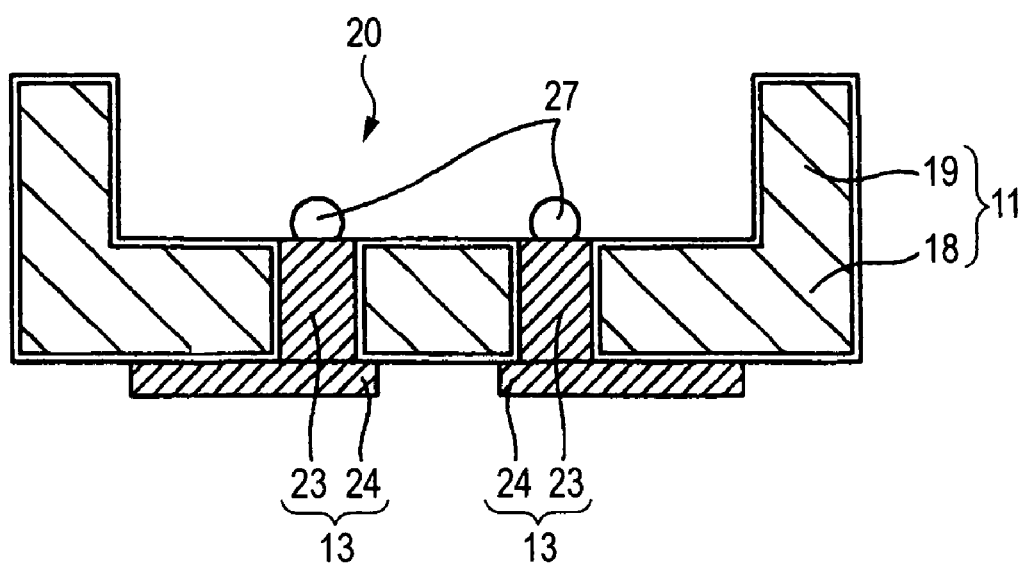
FIG. 3M is a diagram (13) showing the light emitting apparatus manufacturing processing according to the first embodiment of the invention.
Figure 3N:
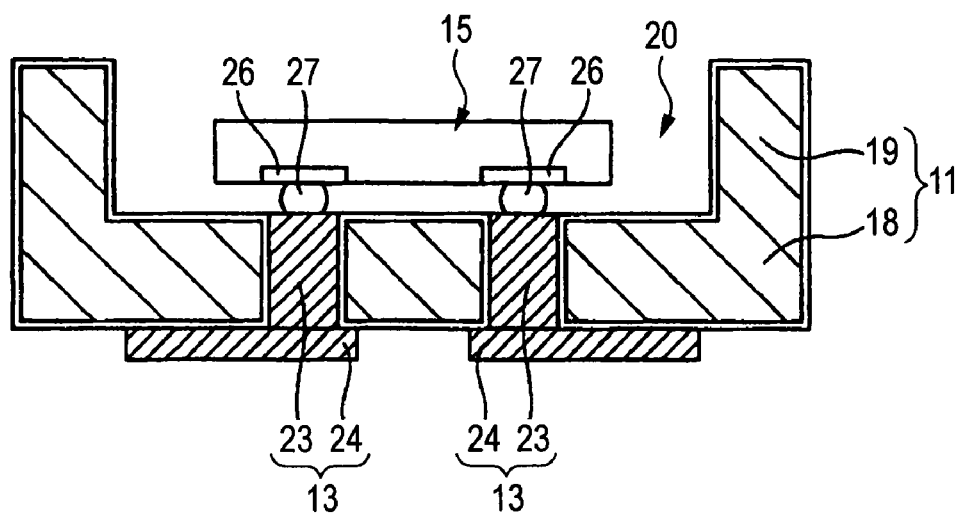
FIG. 3N is a diagram (14) showing the light emitting apparatus manufacturing processing according to the first embodiment of the invention.
Figure 3O:
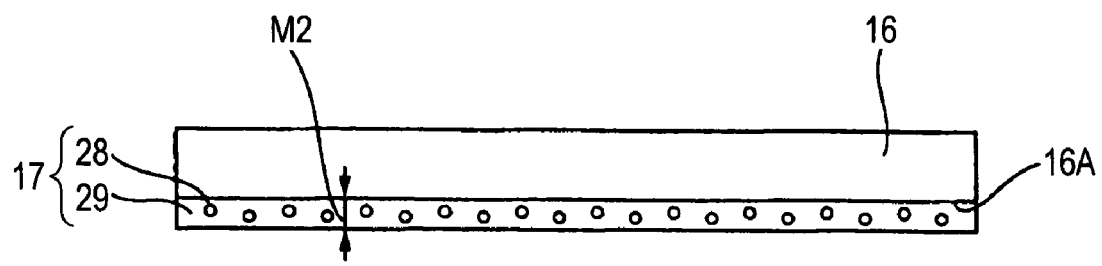
FIG. 3O is a diagram (15) showing the light emitting apparatus manufacturing processing according to the first embodiment of the invention.
Figure 3P:
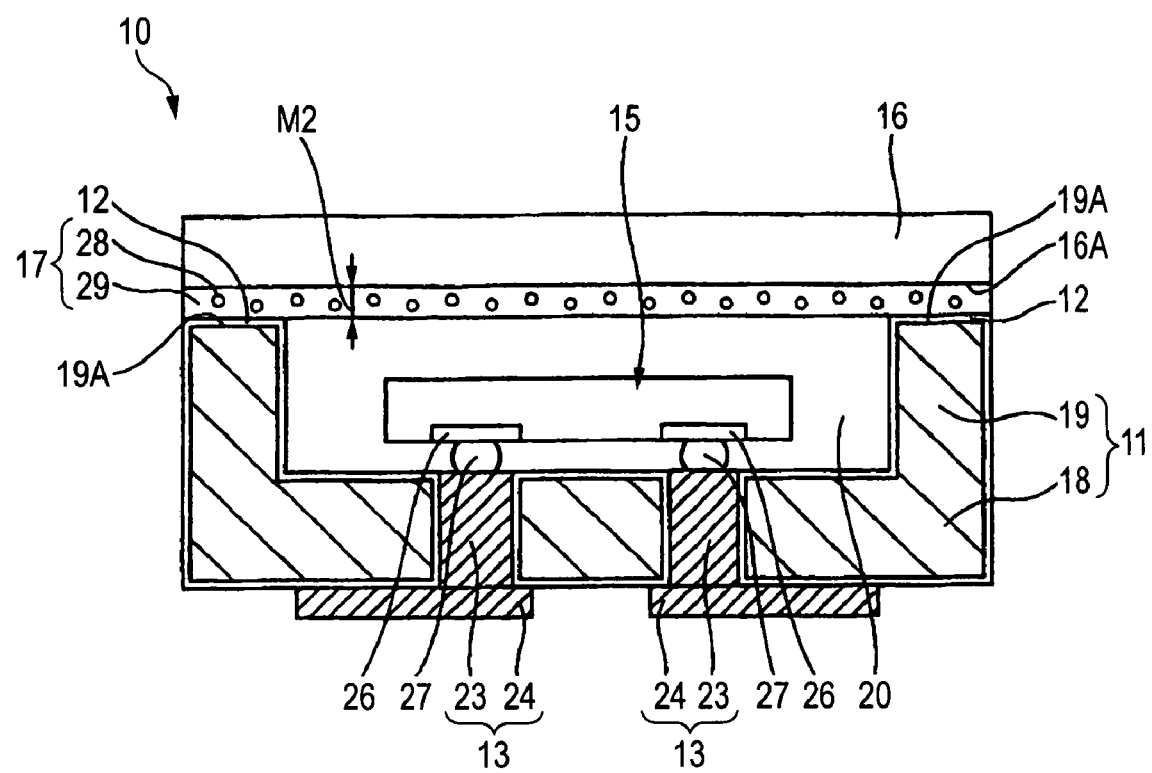
FIG. 3P is a diagram (16) showing the light emitting apparatus manufacturing processing according to the first embodiment of the invention.

FIGS. 3A to 3P are diagrams showing the light emitting apparatus manufacturing processing according to the first embodiment of the invention. In FIGS. 3A to 3P, the same reference numerals as are used for the light emitting apparatus 10 are employed to denote identical or corresponding portions.

First, in a process shown in FIG. 3A, a resist film 32, having an opening 32A, is formed on a base material 31. The opening 32A exposes the base material 31 and corresponds to the formation position of a recessed portion 20. The base material 31 can, for example, be silicon. A thickness M3 of the base material 31 is, for example, 400 μm, and the resist film 32 is, for example, a dry film resist.

In a process in FIG. 3B, the base material 31 is etched by employing anisotropic etching that uses the resist film 32 as a mask, and the recessed portion 20 is formed. Thus, a light emitting device accommodating body 11 having a plate portion 18 and a frame portion 19 is obtained. A thickness M1 of the plate portion 18 is, for example, 200 μm, and a depth D1 of the recessed portion 20 is, for example, 200 µm. Further, a dry etching method, for example, is employed for anisotropic etching.

In a process in FIG. 3C, the resist film 32 is removed, and in a process in FIG. 3D, a resist film 33, in which there are openings 33A, is deposited on a lower face 18B of the plate portion 18. The openings 33A expose the lower face 18B of the plate portion 18 and correspond to the formation positions of through holes 21. The resist film 33 may be, for example, a dry film resist.

In a process in FIG. 3E, the plate portion 18 is etched by anisotropic etching using the resist film 33 as a mask, and the through holes 21 are formed. A dry etching method, for example, is employed for anisotropic etching.

In a process in FIG. 3F, the resist film 33 is removed, so that the light emitting device accommodating body 11 is obtained. Following this, in a process in FIG. 3G, an insulating film 12 is deposited so as to cover the surface (including the walls of the through holes 21) of the light emitting device accommodating body 11. For formation of the insulating film 12, for example, the light emitting device accommodating body 11 is thermally oxidized.

In a process in FIG. 3H, metal foil 35 is glued to the lower face of the resultant structure shown in FIG. 3G. Thereafter, electrolytic plating is performed using the metal foil 35 as a power supply layer, and a metal film is grown through precipitation so as to fill the through holes 21. In this manner, the vias 23 are obtained. Cu foil, for example, is employed as the metal foil 35, and a Cu film, for example, is employed as a metal film that fills the through holes 21.

Besides, the metal foil 35 is glued through a dry film to the lower face of the resultant structure, and portions of the dry film corresponding to the vias 23 are removed by a developing solution which is inlet from the vias 23.

In a process in FIG. 3I, the metal foil 35 is removed by etching, and in a process in FIG. 3J, a metal film 36 is formed to cover the lower face of the structure shown in FIG. 3I. The metal film 36 is to be patterned, using a process in FIG. 3L, and serve as wires 24. An Ni/Au film obtained by laminating an Ni layer and Au layer, in the named order, on the insulating film 12, for example, is employed as the insulating film 36. A sputtering method, for example, can be employed to deposit the metal film 36.

During a process in FIG. 3K, a patterned resist film 38 is formed on a face 36A of the metal film 36. Sequentially, using a process in FIG. 3L, that employs anisotropic etching and uses the resist film 38 as a mask, the metal film 36 is etched until the insulating film 12 is exposed and the wires 24 are obtained. As a result, the wiring pattern, which includes the vias 23 and the wires 24, is obtained.

During a process in FIG. 3M, the resist film 38 is removed, and bumps 27 are formed at the upper ends of the vias 23. Au bumps, for example, can be employed as the bumps 27.

For a process in FIG. 3N, the electrodes 26 of the light emitting device 15 are connected to the welded bumps 27, so that the light emitting device 15 and the wiring pattern 13 are electrically connected.

During a process in FIG. 3O, phosphor-containing, ultraviolet curing resin 17 is formed to cover the face 16A of the light transmitting substrate 16 opposite to the light emitting device accommodating body 11 (phosphor-containing resin formation step). For this process, the phosphor-containing, ultraviolet curing resin 17 has not yet been cured. The phosphor-containing, ultraviolet curing resin 17 is a material wherein phosphor particles 28 are dispersed in an ultraviolet curing resin 29. Thus, when the light emitting apparatus 10 is to emit white light, particles of a yellow emitting phosphor can be employed as the phosphor particles 28. As an example yellow emitting phosphor, a YAG phosphor, can be employed.

The ultraviolet curing resin 29 is a resin that is cured by ultraviolet irradiation, and serves as an adhesive material. The ultraviolet curing resin 29 is made, for example, of a base resin, a photo polymerization initiator and a thermosetting catalyst. An epoxy resin or an acrylic resin, for example, can be employed as a base resin; benzoin ether (specifically, for example, benzoin isopropyl ether) can be employed as a photo polymerization initiator; and an amine catalyst (specifically, for example, diamine or polyamine) can be employed as a thermosetting catalyst.

The phosphor-containing, ultraviolet curing resin 17 can be deposited, for example, by using squeegee printing, spin coating, a dispensing method, offset printing or inkjet printing. A thickness M2 of the phosphor-containing, ultraviolet curing resin 17 depends on desired luminance and chromaticity, and is, for example, 50 µm.

In a process in FIG. 3P, the phosphor-containing, ultraviolet curing resin 17, formed on the structure in FIG. 3O, is brought into contact with the top of the structure in FIG. 3N (specifically, the top of the frame portion 19 where at the insulating film 12 is deposited). Thereafter, the phosphor-containing, ultraviolet curing resin 17 is cured using ultraviolet irradiation, and the light emitting device accommodating body 11 and the light transmitting substrate 16 are adhered to each other (phosphor-containing resin curing step). Specifically, ultraviolet rays having a wavelength of 200 to 400 nm are emitted at a radiant exposure of 2000 mJ/cm$^2$ to cure the phosphor-containing, ultraviolet curing resin 17.

According to the method of this embodiment for manufacturing a light emitting apparatus, the phosphor-containing, ultraviolet curing resin 17, provided for the light transmitting substrate 16, is brought into contact with the insulating film 12, deposited on the upper face 19A of the frame portion 19. Thereafter, the phosphor-containing, ultraviolet curing resin 17 is cured using ultraviolet irradiation, and the light emitting device accommodating body 11 and the light transmitting substrate 16 are adhered to each other. Thus, an adhesive material is not required, and the manufacturing costs of the light emitting apparatus can be reduced.

For this embodiment, a white light emitting diode is employed as the light emitting apparatus 10. However, this embodiment can be also applied for a light emitting apparatus that emits light of other colors. Further, a plurality of ultraviolet curing resin layers containing phosphors that emit different colors may be provided on the face 16A of the light transmitting substrate 16 opposite to the light emitting device accommodating body 11. Also in this case, the same effects as in the embodiment can be obtained.

Second Embodiment

Figure 4:
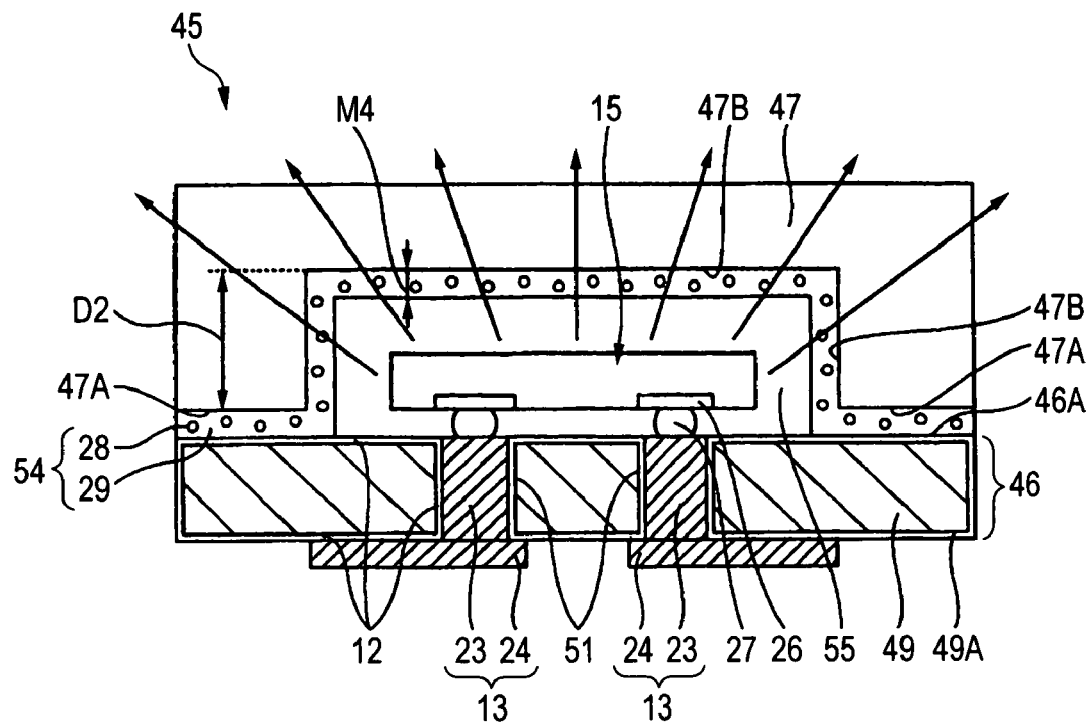
FIG. 4 is a cross-sectional view of a light emitting apparatus according to a second embodiment of the present invention.

FIG. 4 is a cross-sectional view of a light emitting apparatus according to a second embodiment of the present invention. Arrows in FIG. 4 indicate the forward direction of light emitted by a light emitting device 15. In FIG. 4, the same reference numerals as are used for the light emitting apparatus 10 in the first embodiment are provided for identical or corresponding portions.

A light emitting apparatus 45 for the second embodiment will now be described while referring to FIG. 4. The light emitting apparatus 45 includes: a light emitting device 15, a substrate 46, a light transmitting member 47 and a phosphor-containing, ultraviolet curing resin 54. The light emitting apparatus 45 is designed so that light of a desired color is obtained after light emitted by the light emitting device 15 has passed through the phosphor-containing, ultraviolet curing resin 54. A white light emitting diode, for example, can be employed as the light emitting apparatus 45. In the explanation for this embodiment, a white light emitting diode is employed as the light emitting apparatus 45.

The substrate 46 includes a substrate body 49, an insulating film 12 and wiring patterns, each of which is formed of a via 23 and a wire 24. The substrate body 49 is plate shaped, and through holes 51 are formed in the substrate body 49 in order to arrange the vias 23. The material used for the substrate body 49 is, for example, silicon.

The insulating film 12 is deposited to cover the surface (including the walls of the through holes 51) of the substrate body 49. The vias 23 are arranged in the through holes 51, along which the insulating film 12 is formed. The wires 24 are formed on a lower face 49A of the substrate body 49, on which the insulating film 12 is deposited, and are connected to the lower ends of the vias 23.

The light transmitting member 47 is mounted on the substrate 46, using the phosphor-containing, ultraviolet curing resin 54, and has a recessed portion 55 that accommodates the light emitting device 15. The recessed portion 15 may be shaped, for example, like a cylinder or a quadrangular prism, and a depth D2 may be, for example, 200 μm. The light transmitting member 47 is a member that permits the transmission of light emitted by the light emitting device 15, and that encloses the upper face and the side faces of the light emitting device 15. A glass substrate, for example, can be employed as the light transmitting member 47.

The phosphor-containing ultraviolet curing resin 54 is provided to cover a face 47A of the light transmitting member 47, which is opposite to an upper face 46A of the substrate 46, and a face 47B of the light transmitting member 47, which corresponds to the recessed portion 55. The phosphor-containing, ultraviolet curing resin 54 formed on the face 47A of the light transmitting member 47 contacts the upper face 46A of the substrate 46, and the phosphor-containing, ultraviolet curing resin 54 is a material wherein phosphor particles 28 are dispersed in an ultraviolet curing resin 29, i.e., is a material having the same formation as the phosphor-containing, ultraviolet curing resin 17 in the first embodiment. Furthermore, as explained in the first embodiment, the ultraviolet curing resin 29 is to be cured using ultraviolet irradiation and serves as an adhesive material.

As described above, since the phosphor-containing, ultraviolet curing resin 54 is provided to cover the face 47A of the light transmitting member 47 opposite to the substrate 46 and the face 47B of the light transmitting member 47, corresponding to the recessed portion 55, light emitted by the light emitting device 15 always passes through the phosphor-containing, ultraviolet curing resin 54. Therefore, the chromaticity of the light emitting apparatus 45 can be improved.

Further, since the phosphor-containing, ultraviolet curing resin 54 that serves as an adhesive material is provided between the light transmitting member 47 and the upper face 46A of the substrate 46, the substrate 46 and the light transmitting member 47 can be bonded together. Thus, an adhesive material for bonding these two components is not required, and the manufacturing costs of the light emitting apparatus can be reduced.

The phosphor-containing, ultraviolet curing resin 54 can be deposited, for example, by using spin coating, a dispensing method, offset printing or inkjet printing.

A thickness M4 of the phosphor-containing, ultraviolet curing resin 54 depends on the desired luminance and chromaticity values, but is, for example, 50 μm.

According to the second embodiment, since the phosphor-containing, ultraviolet curing resin 54 is formed to cover the face 47A of the light transmitting member 47 opposite to the substrate 46, and the face 47B of the light transmitting member 47 corresponding to the recessed portion 55, the chromaticity of the light emitting apparatus 45 can be improved.

Additionally, since the phosphor-containing, ultraviolet curing resin 54 is arranged between the substrate 46 and the light transmitting member 47 so that these two components adhere to each other, the manufacturing costs of the light emitting apparatus can be reduced.

FIGS. 5A to 5D are diagrams showing the processing for the second embodiment for manufacturing a light emitting apparatus. In FIGS. 5A to 5D, the same reference numerals as are used for the light emitting apparatus 45 of the second embodiment are provided for identical or corresponding portions.

First, in a process in FIG. 2, a substrate 46 is formed by performing the processes in FIGS. 3D to 3L, explained in the first embodiment. Then, in a process in FIG. 5B, for the processes in FIGS. 3M and 3N explained in the first embodiment, a light emitting device 15 is electrically connected to wiring patterns 13 mounted on the substrate 46.

Figure 5A:
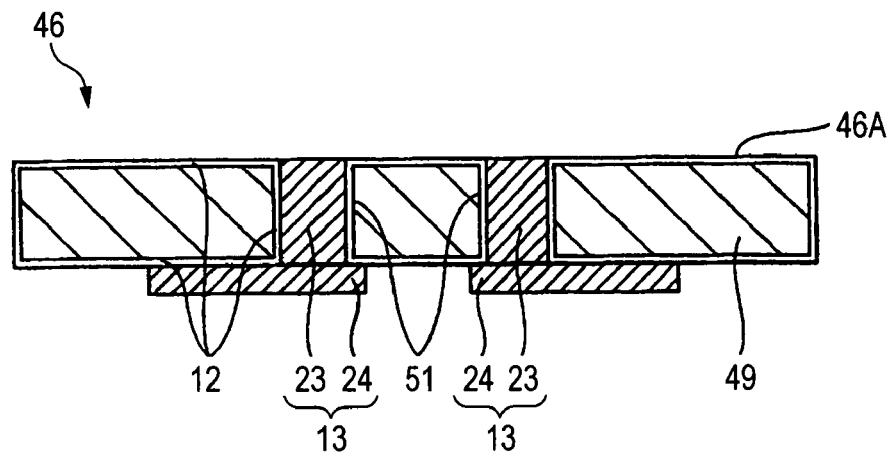
FIG. 5A is a diagram (1) showing the light emitting apparatus manufacturing processing according to the second embodiment of the invention.
Figure 5B:
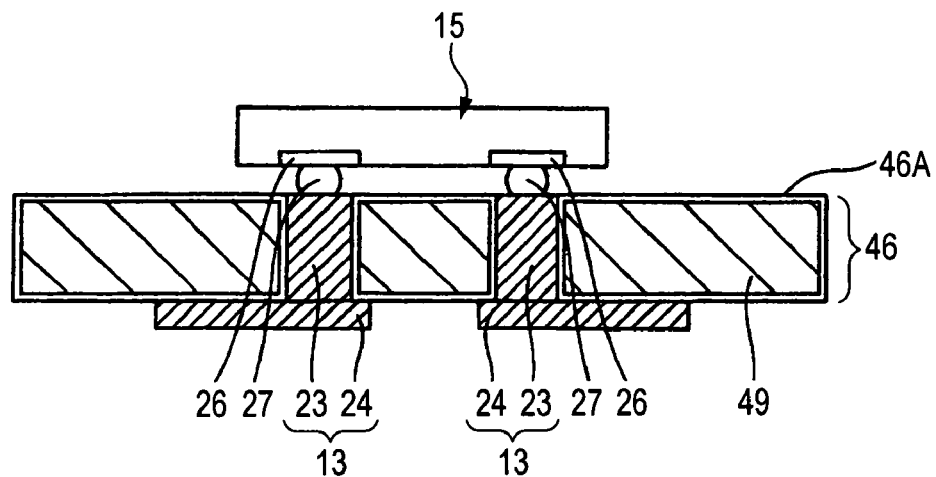
FIG. 5B is a diagram (2) showing the light emitting apparatus manufacturing processing according to the second embodiment of the invention.
Figure 5C:
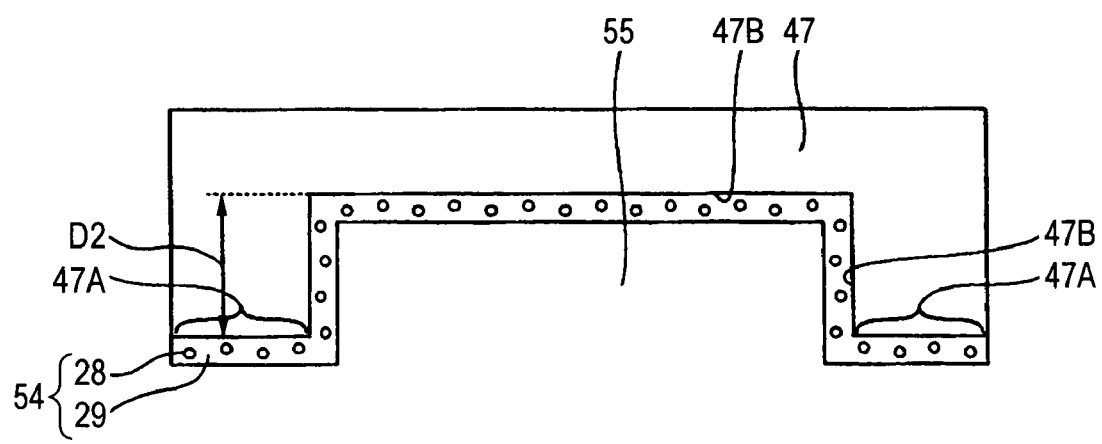
FIG. 5C is a diagram (3) showing the light emitting apparatus manufacturing processing according to the second embodiment of the invention.

For a process in FIG. 5C, a phosphor-containing, ultraviolet curing resin 54 is formed to cover a face 47A of a light transmitting member 47 opposite to the substrate 46, and a face 47B, of the light transmitting member 47, corresponding to a recessed portion 55 (a phosphor-containing resin formation step). At this time, the phosphor-containing, ultraviolet curing resin 54 has not yet been cured.

Figure 5D:
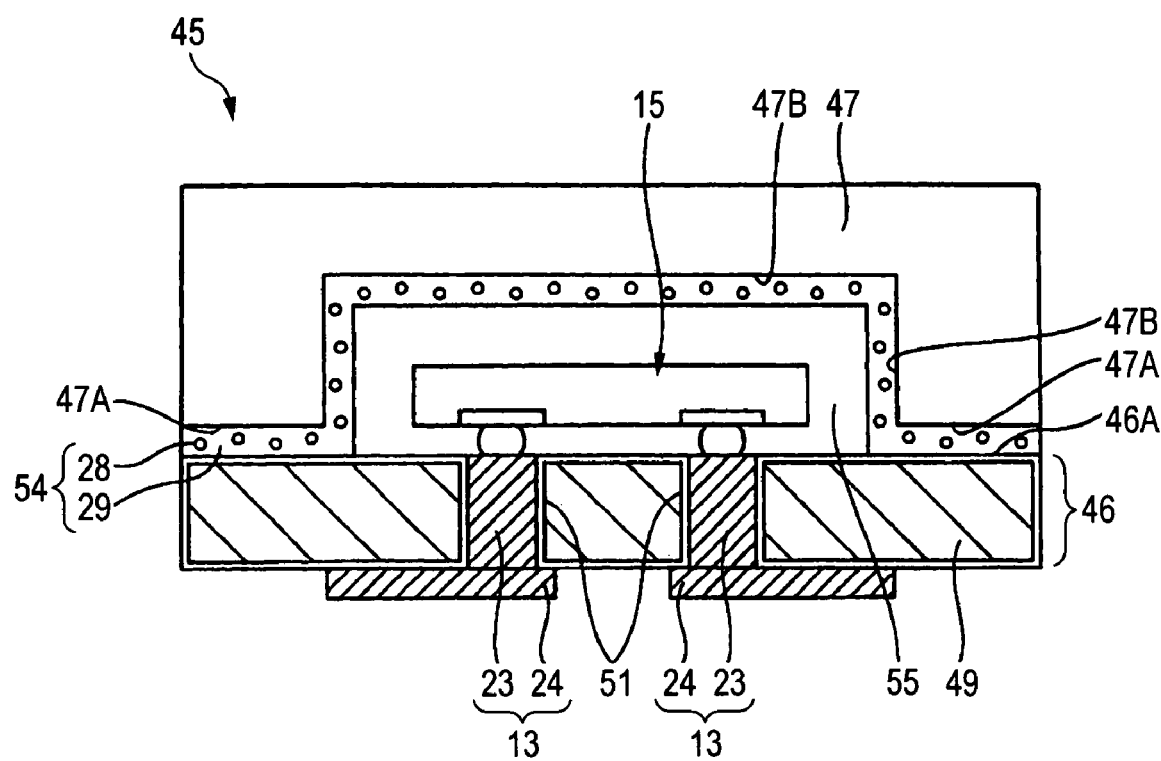
FIG. 5D is a diagram (4) showing the light emitting apparatus manufacturing processing according to the second embodiment of the invention.

Sequentially, during a process in FIG. 5D, the light transmitting member 47 on which the phosphor-containing, ultraviolet curing resin 54 is deposited is brought into contact with an upper face 46A of the substrate 46. Thereafter, the phosphor-containing, ultraviolet curing resin 54 is cured by using ultraviolet irradiation, and the substrate 46 and the light transmitting member 47 are bonded together (a phosphor-containing resin curing step). Specifically, ultraviolet rays having a wavelength of 200 to 400 nm are emitted at a radiant exposure of 2000 mJ/cm$^2$ to cure the phosphor-containing, ultraviolet curing resin 54.

According to the manufacturing method of this embodiment, the light transmitting member on which the phosphor-containing, ultraviolet curing resin 54 is deposited is brought into contact with the upper face 46A of the substrate 46, and thereafter, using ultraviolet irradiation, the phosphor-containing, ultraviolet curing resin 54 is cured so that the substrate and the light transmitting member 47 adhere to each other. As a result, no adhesive material is required to bond together the substrate 46 and the light transmitting member 47, and the manufacturing costs of the light emitting apparatus 45 can be reduced.

In this embodiment, a white light emitting diode is employed as the light emitting apparatus 45. However, this embodiment can also be applied for a light emitting apparatus that emits a light of another color. In addition, a plurality of ultraviolet curing resin layers that contain phosphors and that emit different colors may be provided on the face 47A of the light transmitting member 47, opposite to the substrate 46 and the face 47B of the light transmitting member 47, corresponding to the recessed portion 55. In this case, the same effects as in the second embodiment can be obtained.

Besides, phosphors are contained in the ultraviolet curing resin layers, for example, by about 10 to 70 wt %.

Figure 5E:
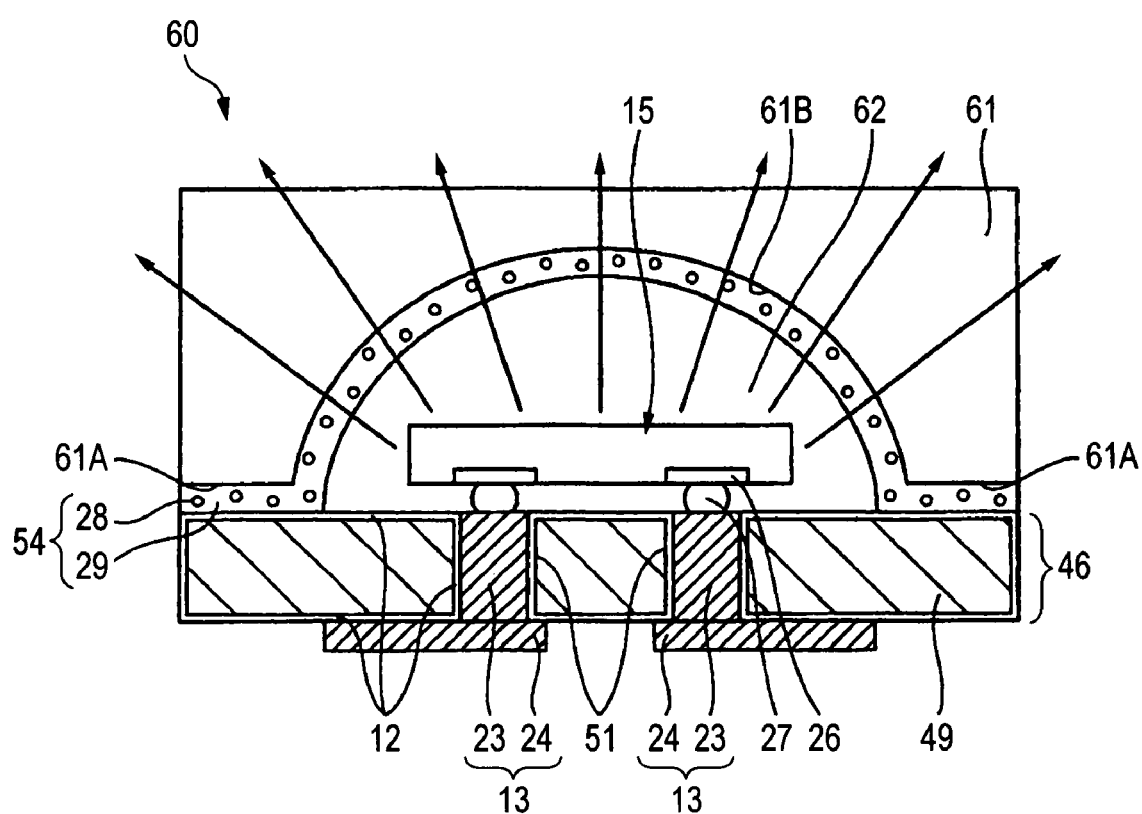
FIG. 5E is a cross-sectional view of a light emitting apparatus according to a modification of the second embodiment.

FIG. 5E is a cross-sectional view of a light emitting apparatus according to a modification of the second embodiment. Arrows in FIG. 5E indicate the forward direction of light emitted by a light emitting device 15. In FIG. 5E, the same reference numerals as are used for the light emitting apparatus 45 in the second embodiment are employed to denote identical or corresponding portions.

While referring to FIG. 5E, a light emitting apparatus 60 has the same arrangement as the light emitting apparatus 45, except that a light emitting member 61 having a hemispherical (dome shaped) recessed portion 62 is provided, instead of the light transmitting member 47 of the light emitting apparatus 45 in the second embodiment, and that a phosphor-containing, ultraviolet curing resin 54 is formed to cover a face 61A of the light transmitting member 61, which is opposite to a substrate 46, and a face 61B of the light transmitting member 61, which corresponds to the recessed portion 62.

For the thus arranged light emitting apparatus 60, the same effects can be acquired as are provided by the light emitting apparatus 45 of the second embodiment. It should be noted that the light emitting apparatus 60 can be provided by the employing the same method as is used for the light emitting apparatus 45 of the second embodiment.

The preferred embodiments of this invention are described in detail. However, the present invention is not limited to these specific embodiments, and can be variously modified or altered without departing from the scope of the invention described in the claims.

The present invention can be applied for a light emitting apparatus, for which the chromaticity can be improved and the manufacturing costs can be reduced, and a manufacturing method therefor.

What is claimed is:

1. A light emitting apparatus comprising:
a light emitting device;
a light emitting device accommodating body, in which a recessed portion is formed to accommodate the light emitting device;
a light transmitting substrate, arranged on the light emitting device accommodating body, for closely sealing the recessed portion; and
a phosphor-containing ultraviolet curing resin, arranged so as to cover and be in contact with an entire face of the light transmitting substrate that is opposite to the light emitting device accommodating body, wherein the entire face includes an upper surface of the light transmitting substrate facing the light emitting device and sealing the recessed portion;
wherein the phosphor-containing ultraviolet curing resin is both an adhesive material which attaches the tight transmitting substrate to the light emitting device accommodating body and a light wavelength changer;
wherein the light emitting device is spaced from the phosphor-containing ultraviolet curing resin.

2. A light emitting apparatus comprising:
a light emitting device;
a substrate, which includes a wiring pattern electrically connected to the light emitting device;
a light transmitting member, which is arranged on the substrate and includes a recessed portion that encloses the light emitting device; and
a phosphor-containing ultraviolet curing resin, arranged so as to cover an entire face of the light transmitting member opposite to the substrate and a face of the light transmitting member corresponding to the recessed portion;
wherein the phosphor-containing ultraviolet curing resin is both an adhesive material which attaches the light transmitting member to the substrate and a light wavelength changer;
wherein the light emitting device is spaced from the phosphor-containing ultraviolet curing resin and the light emitting device is spaced from the light transmitting member.

3. A method for manufacturing a light emitting apparatus that includes a light emitting device, a light emitting device accommodating body including a recessed portion for accommodating the light emitting device, and a light transmitting substrate on the light emitting device accommodating body that closely seals the recessed portion,
the method comprising:
a phosphor-containing resin forming step of forming a phosphor-containing ultraviolet curing resin to cover a face of the light transmitting substrate that is opposite to the light emitting device accommodating body; and
a phosphor-containing resin curing step of bringing the phosphor-containing ultraviolet curing resin, formed on the light transmitting substrate, into contact with the light emitting device accommodating body, wherein the light emitting device is present, and of curing the phosphor-containing ultraviolet curing resin using ultraviolet irradiation to bond the light transmitting substrate to the light emitting device accommodating body with the phosphor-containing ultraviolet curing resin.

4. A method for manufacturing a light emitting apparatus that includes a light emitting device, a substrate including a wiring pattern electrically connected to the light emitting device, and a light transmitting member which is arranged on the substrate and includes a recessed portion that encloses the light emitting device,
the method comprising:
a phosphor-containing resin forming step of forming a phosphor-containing ultraviolet curing resin to cover a face of the light transmitting member opposite to the substrate and a face of the light transmitting member corresponding to the recessed portion; and
a phosphor-containing resin curing step of bringing the phosphor-containing ultraviolet curing resin, formed on the light transmitting member, into contact with the substrate electrically connected to the light emitting device, and of curing the phosphor-containing ultraviolet curing resin using ultraviolet irradiation to bond the light transmitting member to the substrate with the phosphor-containing ultraviolet curing resin.

* * * * *